United States Patent [19]

Avery

[11] Patent Number: 4,651,178

[45] Date of Patent: Mar. 17, 1987

[54] DUAL INVERSE ZENER DIODE WITH BURIED JUNCTIONS

[75] Inventor: Leslie R. Avery, Flemington, N.J.

[73] Assignee: RCA Corporation, Princeton, N.J.

[21] Appl. No.: 739,911

[22] Filed: May 31, 1985

[51] Int. Cl.[4] ............................................. H01L 29/90
[52] U.S. Cl. ....................................... 357/13; 357/40; 357/51; 357/48; 307/318
[58] Field of Search ...................... 357/13, 13 U, 13 Z, 357/51, 40, 48; 307/303, 318

[56] References Cited

U.S. PATENT DOCUMENTS

| | | | |
|---|---|---|---|
| 3,581,164 | 5/1971 | Pfander et al. | 317/234 |
| 3,735,210 | 5/1973 | Kalish et al. | 357/13 |
| 3,798,510 | 3/1974 | Erickson et al. | 357/13 |
| 3,881,179 | 4/1975 | Howard, Jr. | 357/13 |
| 3,997,802 | 12/1976 | Hoehn | 357/13 |
| 4,027,325 | 5/1977 | Genesi | 307/303 |
| 4,126,496 | 11/1978 | Verderber | 357/13 |
| 4,127,859 | 11/1978 | Nelson | 357/13 |
| 4,136,349 | 1/1979 | Tsang | 357/13 |
| 4,213,806 | 7/1980 | Tsang | 148/187 |
| 4,405,933 | 9/1983 | Avery | 357/13 |
| 4,429,324 | 1/1984 | Wilkens | 357/13 |
| 4,441,114 | 4/1984 | Muggli | 357/13 |
| 4,484,206 | 11/1984 | Moroshima et al. | 357/13 |
| 4,511,413 | 4/1985 | Tuttle et al. | 357/13 |

FOREIGN PATENT DOCUMENTS 57-85266  5/1982  Japan ..................................... 357/13

Primary Examiner—Joseph E. Clawson, Jr.
Attorney, Agent, or Firm—Birgit E. Morris; Donald S. Cohen; James M. Trygg

[57] ABSTRACT

A zener diode structure for integrated circuits is disclosed. The device includes a pair of opposing zener diodes separated by a parasitic resistance. The zener breakdown junctions of the two diodes are well below the surface of the device thereby reducing any adverse effect of stray surface charges and ultraviolet radiation. Further, the doping levels of the opposing diodes are selected to reduce drift in the breakdown voltage due to variations in operating temperature of the device.

9 Claims, 2 Drawing Figures

DUAL INVERSE ZENER DIODE WITH BURIED JUNCTIONS

This invention relates to a temperature compensated buried zener diode structure for use in integrated circuit devices.

BACKGROUND OF THE INVENTION

The term zener diode has long been applied to two electrode semiconductor devices operating with respect to the phenomena of the breakdown in semiconductor junctions below approximately 5 volts and of the avalanche effect in such materials at potentials above approximately 5 volts. Zener diode devices are widely used as potential or voltage regulating devices particularly in reference potential generating circuitry. Conventional integrated circuit devices frequently include a number of zener diode devices, a number of transistor devices and auxiliary circuit components and connections on a single semiconductor wafer or chip. Such zener diodes used in these applications have very accurately determined and reproducable zener breakdown voltages. There have been problems, however, associated with these prior art devices usually related to avalanche breakdown at the surface of the device. This is often manifested by drift of the breakdown voltage, for example, as a function of time with changes in temperature. In an effort to improve these devices, zener diodes have been developed with subsurface breakdown junctions. Although such structures experience reduced breakdown at the surface, voltage drift with changes in temperature still remains a problem. There is a present need for an improved integrated circuit zener diode having superior stability and improved drift characteristics through a wide range of temperature applications.

SUMMARY OF THE INVENTION

According to the present invention there is shown a temperature compensating buried zener diode device having a substrate of first conductivity type semiconductor material. A first layer of a second conductivity type semiconducting material having a surface is disposed on the substrate. A second layer of highly doped second conductivity type semiconducting material is arranged between a portion of the substrate and the first layer. A first region of first conductivity type is disposed within and in PN junction forming relation with the first layer and extends downwardly from the surface directly over but not in contact with one end of the second layer. A second region of highly doped second conductivity type within said first layer is arranged in PN junction forming relation with the first region below the surface and extends downwardly into contact with the one end of the second layer. A third region of highly doped first conductivity type is arranged in the first layer, and extends downwardly from the surface into PN junction forming relation with the other end of the second layer.

DESCRIPTION OF THE PREFERRED EMBODIMENT

Figure 1:
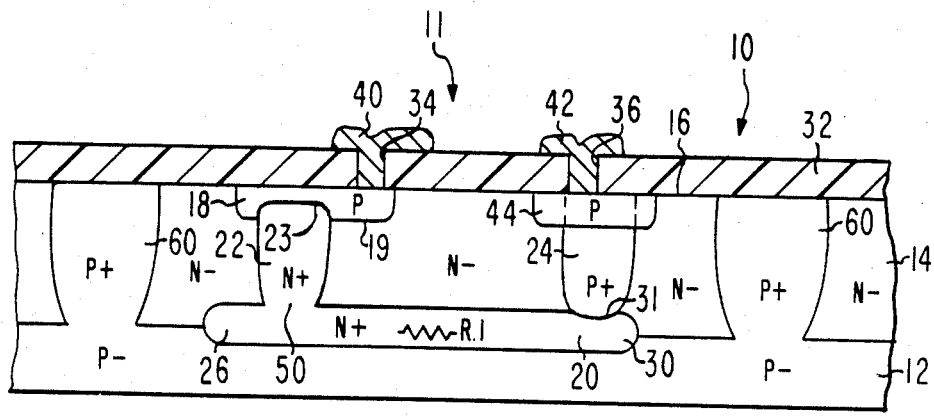
FIG. 1 is a cross sectional view of a portion of an integrated circuit device embodying the teachings of the present invention.

There is shown in FIG. 1 a portion of an integrated circuit device 10 having a temperature compensated zener diode structure 11 formed therein. The device 10 includes a substrate 12 of a first conductivity type material, which is lightly doped P type in the present example. An epitaxial layer 14 of a second conductivity type material, which is lightly doped N type, is disposed over the substrate 12. The layer 14 includes a planar surface 16 on a side opposite that of the substrate 12. The zener diode structure 11 includes a first region 18 of first conductivity type material, which is moderately doped P type, having a resistance of from about 25 to 250 ohms per square and is diposed in PN junction forming relation with the layer 14. A second semiconductor layer 20 of second conductivity type material, which is highly doped N type, is disposed between a portion of the substrate 12 and the first layer 14. One end of the second layer 20 is arranged directly below the region 18. A second region 22 of second conductivity type material, which is highly doped N type, is arranged in PN junction forming relation with the first region 18 and forms a first zener breakdown junction 23 well below the surface 16. As is shown in FIG. 1, the lower surface 19 of the region 18 substantially surrounds the zener breakdown junction 23 and is somewhat deeper with respect to the surface 16. The region 22 extends downwardly into contact with one end 26 of the second layer 20. That is, the second region 22 is made to intersect the second layer 20 at the end 26. The second layer 20 and second region 22 both are doped so that they have a resistance of from about 20 to 100 ohms per square. A third region 24 of first conductivity type material, which is highly doped P type, is formed in the first layer 14, extends downwardly from the surface 16, and is in PN junction forming relation with the other end 30 of the second layer 20 thereby forming a second zener breakdown junction 31. The third region 24 has a resistance of from about 2 to 30 ohms per square near the surface 16.

An insulating layer 32, which may be for example silicon dioxide, overlies the surface 16. A contact opening 34 is formed in the layer 32 ocver the first region 18 but offset so that it is not directly over the zener breakdown junction 23 as shown in FIG. 1. This assures that a metal contact subsequently formed in the opening 34 will be directly over the somewhat thicker portion of the region 18 which surrounds the zener breakdown junction 23. Another contact opening 36 is arranged over the third region 24. A terminal or conductor 40, comprising the anode of the zener diode 11, is arranged in ohmic contact with the first region 18 through the opening 34, as shown in FIG. 1. Another terminal or conductor 42, comprising the cathode of the zener diode structure 11, is arranged in ohmic contact with the third region 24 at the surface 16 as shown in FIG. 1.

A variation of the ohmic contact between the conductor 42 and the third region 24 may include a fourth region 44 of moderately doped P type conductivity material having a resistance of from about 25 to 250 ohms per square interposed therebetween. This fourth region 44 may be formed concurrently with the forming of the first region 18 without departing from standard manufacturing processes and without additional processing steps. There is a substantial advantage realized by use of the fourth region 44 in that the thickness of the layer 32, which is usually oxide, over the regions 24 and 18 will be substantially the same. This results in substantially identical etch times for etching the contact openings 34 and 36. Without the fourth region 44 the thickness of the oxide layer 32 would be substantially greater over the region 24 than over the region 18.

Figure 2:
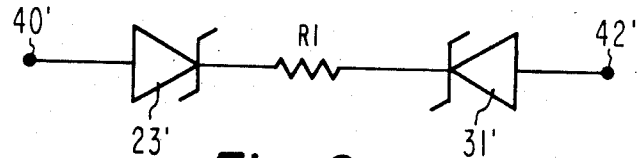
FIG. 2 is a schematic diagram illustrating the electrical circuit of the device of FIG. 1.

FIG. 2 shows a circuit diagram of the temperature compensated zener diode device 11. The anode terminal 40' and cathode terminal 42' of FIG. 2 correspond to the two metal contacts 40 and 42 respectively shown in FIG. 1. The zener diode 23' of FIG. 2 is the zener breakdown junction 23 which is formed at the interface between the first and second regions 18 and 22 as shown in FIG. 1. Similarly, the zener diode 31' of FIG. 2 is the zener breakdown junction 31 which is formed at the interface between the second layer 20 and the third region 24 as shown in FIG. 1. In the arrangement shown in FIG. 2 the zener diode 31' is forward biased. The parasitic resistor R1 interconnects the cathodes of the two zener diodes 23' and 31' and represents the portion of the layer 20 which lies between the area 50 and the zener breakdown junction 31, as best seen in FIG. 1.

It will be appreciated by those skilled in the art that the two zener breakdown junctions 23 and 31 are both well below the surface 16 of the device 11 and, therefore, avoid the problems commonly associated with zener junctions which extend to the surface, such as drift of the breakdown voltage as a function of time. Additionally, for this reason, these zener junctions are less susceptible to strong surface charges and ultraviolet radiation. This, of course, is a substantial advantage when utilizing this type of zener diode in certain applications where ultraviolet radiation is present and stray surface charges are difficult to control. To further improve performance the zener diode structure 11 may be isolated from other devices on the integrated circuit 10 by forming highly doped P type regions 60 which completely surround the structure 11 and extend from the surface 16 downwardly into contact with the P type substrate 12. Such structures and the methods of making them are well known in the art.

A further advantage of this structure is that the two opposing zener diodes 23' and 31' may be arranged so that the zener diode 31' offsets a substantial portion of the breakdown voltage increase or decrease which commonly occurs in the zener diode 23' due to variations in operating temperature of the device. This occurs because the zener diode 23' has a positive temperature coefficient, that is, its breakdown voltage increases with increasing temperature, and the zener diode 31' being used in its forward biased mode, has a negative temperature coefficient. By a suitable choice of doping levels, it is possible to achieve temperature compensation to a significant degree by the resulting reduction in the positive temperature coefficient of the zener diode 23'.

By reversing the anode and cathode connections of the zener diode structure 11, the zener diode 31' becomes reversed biased and the zener diode 23' becomes forward biased. The zener diode 31' has a higher zener breakdown voltage than the zener diode 23' because of the lower doping density at the breakdown junction 31. While, in this case, the zener diode 31' has a larger temperature coefficient, substantial temperature compensation is still obtainable. With this arrangement, that is, by reversing the anode and cathode connections, a higher overall zener voltage is achieved for the zener diode structure 11.

I claim:

1. A temperature compensating buried zener diode device comprising:
    (a) a substrate of a first conductivity type semiconductor material;
    (b) a first layer of a second conductivity type semiconductor material disposed on said substrate and having a surface;
    (c) a second layer of highly doped second conductivity type semiconductor material disposed between a portion of said substrate and said first layer and being more highly doped than said first layer;
    (d) a first region of first conductivity type disposed within and in PN junction forming relation with said first layer and extending downwardly from said surface directly opposed but not in contact with one end of said second layer;
    (e) a second region of highly doped second conductivity type within said first layer in PN junction forming relation with said first region below said surface thereby forming a first zener breakdown junction between said first and second regions and extending downwardly into contact with said one end of said second layer; and
    (f) a third region of highly doped first conductivity type in said first layer extending downwardly from said surface and into PN junction forming relation with another end of said second layer thereby forming a second zener breakdown junction therebetween having a lower doping density than that of said first zener breakdown junction.

2. The device set forth in claim 1 wherein said first region includes a portion which completely surrounds said zener breakdown junction.

3. The device set forth in claim 2 wherein said portion of said first region is deeper than said zener breakdown junction with respect to said surface.

4. The device set forth in claim 3 wherein said first regions is of P type conductivity material having an electrical resistance of from about 25 to 250 ohms per square.

5. The device set forth in claim 4 wherein said second region and said second layer are of N type conductivity material having an electrical resistance of from about 20 to 100 ohms per square.

6. The device set forth in claim 5 wherein said third region is of P type conductivity material having a resistance of from about 2 to 30 ohms per square.

7. The device set forth in claim 6 including a first terminal in ohmic contact with said portion of said first region, said first terminal comprising an anode of said device.

8. The device set forth in claim 7 including a second terminal in ohmic contact with said third region, said second terminal comprising a cathode of said device.

9. The device set forth in claim 8 including a fourth region of P type conductivity material interposed between said second terminal and said third region, said fourth region having a resistance of from about 25 to 250 ohms per square.

* * * * *